United States Patent [19]
Riley, Jr. et al.

[11] Patent Number: 5,635,456
[45] Date of Patent: Jun. 3, 1997

[54] PROCESSING FOR BI/SR/CA/CU/O-2223 SUPERCONDUCTORS

[75] Inventors: Gilbert N. Riley, Jr., Marlborough; Alexander Otto; William L. Carter, both of Chelmsford, all of Mass.

[73] Assignee: American Superconductor Corporation, Westborough, Mass.

[21] Appl. No.: 41,822

[22] Filed: Apr. 1, 1993

[51] Int. Cl.[6] .......................... C04B 35/64; C04B 35/653; C04B 35/50; H01B 12/00

[52] U.S. Cl. .......................... 505/501; 505/450; 505/492; 505/742; 505/739; 264/345; 264/175; 264/211.12; 252/521

[58] Field of Search .......................... 505/1, 739, 725, 505/740, 741, 742, 450, 492, 501; 264/345, 175, 211.12, 570, 239; 252/518, 521

[56] References Cited

U.S. PATENT DOCUMENTS

| | | | |
|---|---|---|---|
| 4,992,415 | 2/1991 | Ashok | 505/740 |
| 5,045,527 | 9/1991 | Ikeno | 505/740 |
| 5,047,391 | 9/1991 | Bock | 505/739 |
| 5,063,201 | 11/1991 | Rao | 505/739 |
| 5,126,054 | 6/1992 | Farzin-Nia | 264/345 |
| 5,145,829 | 9/1992 | Asano | 505/739 |
| 5,149,684 | 9/1992 | Woolf | 505/742 |
| 5,204,315 | 4/1993 | Ito | 505/740 |
| 5,208,215 | 5/1993 | Chen | 505/740 |
| 5,246,917 | 9/1993 | Hikata | 505/740 |

FOREIGN PATENT DOCUMENTS

| | | |
|---|---|---|
| 0 390 499 A2 | 10/1990 | European Pat. Off. . |
| 0 499 411 A1 | 8/1992 | European Pat. Off. . |
| 1275434 A | 11/1989 | Japan . |
| 3179788 | 2/1990 | Japan . |
| 230404 | 5/1991 | New Zealand . |
| WO 93/22799 | 11/1993 | WIPO . |

OTHER PUBLICATIONS

McGinn "Microstructure and critical current density . . . " *Appl. Phys. Lett.* v. 59(1) Jul. 1, 1991 pp. 120-122.

McCallum "Incongruent melting of high Tc superconductor . . . " XVII International Conf on Low Temp Physics Aug. 1987, pp. 1-2.

"Fabrication and Critical Current Density of Ag-Sheathed Bi(Pb)SrCaCuO Superconducting Wires," by S.X. Dou. Publication date not known, if any. No Pub Info.

"Growth of the 2223 Phase in Leaded Bi-Sr-Ca-Cu Oxide Reduced Oxygen Partial Pressure" by Aota et al. *Jap. J. of Appl. Phys.* 28 (12), L2196-9 (Dec., 1989).

"Critical Issues in the OPIT Processing of High-$J_c$ BSCCO Superconductors," by K.H. Sandhage et al. *J. Mat. Met. Metal*, 21-25 (Mar., 1991).

"Effect of a Controlled Melt Process On Phase Transformation and Electromagnetic Properties of BiPbSrCaCuO/Ag Superconducting Wires," by Y.C. Guo et al. *Applied Superconductivity* 1 (1/2), 25-31 (Jan., 1993).

"Growth of the 2223 Phase in Leaded Bi-Sr-Ca-Cu-O System," by Takeshi Hatano et al. *Jap. J. of Appl. Phys.* 27 (11) L2055-L2058 (Nov., 1988).

(List continued on next page.)

*Primary Examiner*—Paul Lieberman
*Assistant Examiner*—M. Kopec
*Attorney, Agent, or Firm*—Choate, Hall & Stewart

[57] ABSTRACT

A method for preparing an oxide superconductor article includes exposing the article after deformation of the article to a final heat treatment having the steps of (a) heating the article at a temperature sufficient to partially melt the article, such that a liquid phase co-exists with the desired oxide superconductor phase; and (b) cooling to and holding the article at a temperature sufficient to transform the liquid phase into the desired oxide superconductor, where no deformation occurs after the final heat treatment. The liquid phase of step (a) wets surfaces of a defect contained within the mixed phase, whereby upon transformation of the liquid in step (b) to the desired oxide superconductor, the defect is healed.

21 Claims, 2 Drawing Sheets

OTHER PUBLICATIONS

"Development of High–$T_c$ Superconductor Wires for Magnet Applications," by J. Tenbrink et al. *IEEE Trans. Mag.* 27 (2), 1239–1246 (Mar., 1991).

"Phase Diagrams for High $T_c$ Superconductors," Ed. John D. Whitler and Robert S. Roth. *The American Ceramic Society*, Westerville, Ohio (1991). (Cover Sheet Only) No month provided.

"Thermostability and Decomposition of the (Bi, Pb)$_2$Sr$_2$Ca$_2$Cu$_3$O$_{10}$ Phase in Silver–Clad Tapes" by Luo et al. *J. of Appl. Phys.* 72 (6), 2385–2389 (Sep., 1992).

"Kinetics and Mechnaism of the (Bl, Pb)$_2$Sr$_2$Ca$_2$Cu$_3$O$_{10}$ Formation Reaction in Silver–Sheathed Wires" by Luo et al. *Appl. Sup.* 1(1/2), 101–107 (Jan., 1993).

"The Effect of Sintering Conditions on the Formation of the High–$T_c$ Phase in the Bi–Sr–Ca–Cu–O System," by S. Kobayashi et al. *Jap. J. Appl. Phys.* 28 L772–L774 (1989). May.

"Preparation of the Textured Bi–Based Oxide Tapes by Partial Melting Process," by J. Kase et al. *IEEE Trans. Mag.* 27 (2), 1254–1257 (Mar. 1991).

"Investigation of Heat–Treating Conditions for Silver–Sheathed Bi2212 Superconducting Coils" Shibutani et al. *Jpn. J. Appl. Phys.* 30(12A), 3371–3376 (Dec., 1991).

"Critical Current Enhancement in Silver–Clad Bi$_2$Sr$_2$CaCu$_2$O$_x$ Wires Using a Statistical Experimental Design for Heat Treatment Optimization" Bowker, J. and Whitlow, G. *Jpn. J. Appl. Phys.* 32(1), 51–54 (Jan., 1993).

"Effects of Heating Temperature and Atmosphere on Critical Current Density of Bi$_2$Sr$_2$Ca$_1$Cu$_2$Ag$_{0.8}$O$_y$ Ag–sheathed Tapes" Endo, A. and Nishikida, S. *IEEE Trans. Appl. Supercond.* 3(1), 931–934 (Mar., 1993).

PROCESSING FOR BI/SR/CA/CU/O-2223 SUPERCONDUCTORS

FIELD OF THE INVENTION

The present invention relates to high-performance oxide superconductors and oxide superconductor composites. The present invention further relates to a method for healing defects introduced into the oxide superconductor phase during processing thereby improving superconducting properties.

BACKGROUND OF THE INVENTION

Oxide superconductors of the rare earth-barium-copper-oxide family (YBCO), bismuth(lead)-strontium-calcium-copper-oxide family ((Bi,Pb)SCCO) and thallium-barium-calcium-copper-oxide family (TBCCO) form plate-like and highly anisotropic superconducting oxide grains. Because of their plate-like morphology, the oxide grains can be oriented along the direction of an applied strain. Mechanical deformation has been used to induce grain alignment of the oxide superconductor c-axis perpendicular to the plane or direction of elongation. The degree of alignment of the oxide superconductor grains is a major factor in the high critical current densities ($J_c$) obtained in articles prepared from these materials.

Known processing methods for obtaining textured oxide superconductor composite articles include an iterative process of alternating anneal and deformation steps. The anneal is used to promote reaction-induced texture of the oxide superconductor in which the anisotropic growth of the superconducting grains is enhanced. Each deformation provides an incremental improvement in the orientation of the oxide grains. Heat treatment intermediate with or subsequent to deformation is also required to form the correct oxide superconductor phase, promote good grain interconnectivity and achieve proper oxygenation.

Processing long lengths of oxide superconductor is particularly difficult because deformation leads to microcracking and other defects which may not be healed in the subsequent heat treatment. Cracks that occur perpendicular to the direction of current flow limit the performance of the superconductor. In order to optimize the current carrying capability of the oxide superconductor, it is necessary to heal any microcracks that are formed during processing of the oxide superconductor or superconducting composite.

Liquid phases in co-existence with solid oxide phases have been used in processing of oxide superconductors. One type of partial melting, known as peritectic decomposition, takes advantage of liquid phases which form at peritectic points of the phase diagram containing the oxide superconductor. During peritectic decomposition, the oxide superconductor remains a solid until the peritectic temperature is reached, at which point the oxide superconductor decomposes into a liquid phase and a new solid phase. The peritectic decompositions of $Bi_2Sr_2CaCu_2O_{8+x}$ (BSCCO-2212, where $0 \leq x1.5$), into an alkaline earth oxide and a liquid phase and of $YBa_2Cu_3O_{7-\delta}$ (YBCO-123, where $0 \leq \delta 1.0$) into $Y_2BaCuO_5$ and a liquid phase are well known.

Peritectic decomposition of an oxide superconductor and the reformation of the oxide superconductor from the liquid+solid phase is the basis for melt textured growth of YBCO-123 and BSCCO-2212. For example, Kase et al. in IEEE Trans. Mag. 27(2), 1254 (Mar. 1991) report obtaining highly textured BSCCO-2212 by slowly cooling through the peritectic point. This process necessarily involves total decomposition of the desired 2212 phase into an alkaline earth oxide and a liquid phase.

It is also recognized that oxide superconductors, in particular, can coexist with a liquid phase under suitable processing conditions. This may occur by solid solution melting, eutectic melting or by formation of nonequilibrium liquids. Solid solution melting may arise in a phase system, in which the oxide superconductor is a solid solution. As the temperature (or some other controlling parameter) of the system increases (or decreases), the oxide superconductor phase changes from a solid oxide phase to a liquid plus oxide superconductor partial melt (this happens at the solidus). A further increase in temperature (or some other controlling parameter) affords the complete melting of the oxide superconductor (this happens at the liquidus).

A phase diagram containing a eutectic point may provide an oxide superconductor partial melt, known as eutectic melting, when the overall composition is chosen so as to be slightly off stoichiometry. As the temperature (or some other controlling parameter) of the system increases (or decreases), the mixed phase of oxide superconductor-plus-nonsuperconducting oxide ($solid_1+solid_2$) changes to a liquid-plus-oxide superconductor partial melt ($solid_1$+liquid).

Non-equilibrium liquids may also promote partial melting in oxide superconductor systems. A non-equilibrium liquid is established, usually through rapid heating of a mixture of oxides to a temperature above their eutectic melting point. As the oxides form the desired oxide superconductor, the solid and liquid phases can co-exist, if only temporarily.

Partial melting of $(Bi,Pb)_2Sr_2Ca_2Cu_3O_{10+x}$ ((Bi,Pb)SCCO-2223, where $0 \leq x \leq 1.5$) and $(Bi)_2Sr_2Ca_1Cu_2O_{10+x}$ ((Bi)SCCO-2223, where $0 \leq x \leq 1.5$) at temperatures above 870° C. in air has been reported; see, for example, Kobayashi et al. Jap. J. Appl. Phys. 28, L722–L744 (1989), Hatano et al. Ibid. 27(11), L2055 (Nov. 1988), Luo et al. Appl. Super. 1, 101–107, (1993), Aota et al. Jap. J. Appl. Phys. 28, L2196–L2199 (1989) and Luo et al. J. Appl. Phys. 72, 2385–2389 (1992). The exact mechanism of partial melting of BSCCO-2223 has not been definitively established.

Guo et al. in Appl. Supercond. 1(½), 25 (Jan. 1993) have described a phase formation-decomposition-reformation (PFDR) process, in which a pressed sample of (Bi,Pb)SCCO-2223 is heated above its liquidus to decompose the 2223 phase, followed by a heat treatment at a temperature below the solidus. The sample was subsequently pressed again and reannealed. The final anneal of the PFDR process includes a standard single step heat treatment in which there is no melting.

Partial melting in the processing of oxide superconductors has been used either to increase the yield of the BSCCO-2223 phase or to improve the contiguity and texturing of the oxide superconductor grains. The issue of healing defects, such as microcracks, which develop during processing of the oxide superconductor, has not been addressed. Further, the prior art has not addressed the possibility of using a two-step process where the oxide superconductor is stable in both steps for the healing of cracks and defects.

It is the object of the present invention to provide a method for improving superconducting performance of oxide superconductors and superconducting composites by healing cracks and defects formed during processing of oxide superconductors and superconducting composites.

It is a further object of the invention to prepare oxide superconducting articles having significantly less cracks and defects than conventionally-processed articles.

A feature of the invention is a final two-step heat treatment which introduces a small amount of a liquid phase co-existing with the oxide superconductor phase, and then transforms the liquid back into the oxide superconductor phase with no deformation occurring during or after the final heat treatment.

An advantage of the invention is the production of highly defect-free oxide superconductor and superconducting composites which exhibit superior critical current densities.

SUMMARY OF THE INVENTION

In one aspect of the present invention, an oxide superconductor article containing a desired oxide superconductor phase is exposed to a final heat treatment after deformation of the article, which includes (a) heating the article at a temperature sufficient to partially melt the article, such that a liquid phase co-exists with the desired oxide superconductor phase; and (b) cooling the article to a temperature sufficient to transform the liquid phase into the desired oxide superconductor, with no deformation occurring after the final heat treatment.

In another aspect of the invention, an oxide superconductor article containing a desired oxide superconductor phase is exposed to a final heat treatment after deformation of the article which includes (a) forming a liquid phase in the oxide superconducting article, such that the liquid phase coexists with the desired oxide superconductor solid phase; and then (b) transforming the liquid phase into the desired oxide superconductor, with no deformation occurring after the final heat treatment.

In preferred embodiments, the liquid phase wets surfaces of defects contained within the oxide superconductor article. The defects are healed upon transformation of the liquid to the desired oxide superconductor. The partial melting of step (a) and the transformation of step (b) are effected by selection of appropriate thermodynamic state variables, for example, temperature, $P_{O2}$, $P_{total}$ and total composition. In principle, deformation may occur during the final heat treatment up to immediately prior to the completion of step (a), providing that the liquid phase is available for a period of time sufficient to wet defect surfaces.

By "final heat treatment", as that term is used herein, it is meant a heat treatment for forming an oxide superconductor after which no further deformation occurs. However, heat treatments for purposes other than those stated herein, such as, for example, oxygenation of the oxide superconductor, are possible.

By "partial melt", as that term is used herein, it is meant the oxide superconductor article is only partially melted, and that the desired oxide superconductor is present during melting.

By "deformation" as that term is used herein, it is meant a process which causes a change in the cross-sectional shape of the article.

By "oxide superconductor precursor", as that term is used herein, it is meant any material that can be converted to an oxide superconductor upon application of a suitable heat treatment. Suitable precursor materials include but are not limited to metal salts, simple metal oxides, complex mixed metal oxides and intermediate oxide superconductors to the desired oxide superconductor.

By "desired oxide superconductor", as that term is used herein, it is meant the oxide superconductor which it is desired to ultimately prepare. An oxide superconductor is typically the "desired" oxide superconductor because of superior electrical properties, such as high $T_c$ and/or $J_c$. The desired oxide superconductor is typically a high $T_c$ member of a particular oxide superconductor family, i.e., BSCCO-2223, YBCO-123, TBCCO-1212 and TBCCO-1223.

By "intermediate oxide superconductor", as that term is used herein, it is meant an oxide superconductor which is capable of being converted into a desired oxide superconductor. However, an intermediate oxide superconductor may have desirable processing properties, which warrants its formation initially before final conversion into the desired oxide superconductor. The formation of an "intermediate oxide superconductor" may be desired, particularly during anneal/deformation iterations, where the intermediate oxides are more amenable to texturing than the desired oxide superconductor.

In yet another aspect of the present invention, a textured oxide superconductor article is prepared by subjecting an article containing an oxide superconductor precursor to at least one first anneal/deformation iteration. The anneal is effective to form a desired oxide superconductor. The resultant oxide superconductor phase is textured upon application of the first anneal/deformation iteration. The article is then exposed to a final heat treatment in which (a) the article is partially melted, such that a liquid phase co-exists with the desired textured oxide superconductor phase; and (b) the liquid phase is transformed into the desired oxide superconductor, with no deformation occurring after the final heat treatment.

In yet another aspect of the present invention, a textured oxide superconductor article is prepared by subjecting an article containing an oxide superconductor precursor to at least one first anneal/deformation iteration. The anneal is effective to form an intermediate oxide superconductor. The intermediate textured oxide superconductor phase is formed. The article is then subjected to at least one second anneal/deformation iteration. The anneal is effective to form a desired oxide superconductor. The desired textured oxide superconductor is formed. The article is then exposed to a final heat treatment in which (a) the article is partially melted, such that a liquid phase co-exists with the desired textured oxide superconductor phase; and (b) the liquid phase is transformed into the desired oxide superconductor, with no deformation occurring after the final heat treatment.

In preferred embodiments, the intermediate oxide superconductor is BSCCO-2212 or (Bi,Pb)SCCO-2212 because it is readily textured by the deformation/anneal iterations. The intermediate oxide superconductor is then converted to a desired oxide superconducting phase, typically BSCCO2223 or (Bi,Pb)SCCO-2223. The partial melting of step (a) may be carried out at a temperature in the range of 820°–835° C. at 0.075 atm $O_2$. The transformation of the liquid in step (b) may be carried out at a temperature in the range of 790°–820° C. at 0.075 atm $O_2$. In other preferred embodiments, the desired oxide superconductor, may be YBCO-123, $Y_2Ba_4Cu_7O_{14-\delta}$ (YBCO-247), $(Tl,Pb)_1Ba_2Ca_1Cu_2O_{6.0\pm y}$ (TBCCO-1212) or $(Tl,Pb)_1Ba_2Ca_2Cu_3O_{8.0\pm y}$ (TBCCO-1223), where $0 \leq \delta \leq 1.0$ and y ranges up to 0.5. The stated stoichiometries are all approximate and intentional or unintentional variations in composition are contemplated within the scope of the invention.

In other preferred embodiments, the liquid phase is formed in the range of 0.1–30 vol %. In yet other preferred embodiments, the anneal of the first and second anneal/deformation iterations partially melts the oxide superconductor article.

In yet another aspect of the invention, an oxide superconductor article is exposed to a final heat treatment after a deformation step, which includes (a) heating the article at a temperature substantially in the range of 810°–860° C. for a period of time substantially in the range of 0.1 to 300 hours at a $P_{O_2}$ substantially in the range of 0.001–1.0 atm; and (b) cooling the article to a temperature substantially in the range of 780°–845° C. for a period of time substantially in the range of 1 to 300 hours at a $P_{O_2}$ substantially in the range of 0.001–1.0 atm, with no deformation occurring after the final heat treatment In yet another aspect of the present invention, an oxide superconductor article containing a desired oxide superconductor phase is exposed to a final heat treatment after a deformation step, which includes (a) subjecting the article to an oxygen partial pressure sufficient to partially melt the oxide superconducting article, such that a liquid phase co-exists with the desired oxide superconductor; and (b) raising to an oxygen partial pressure sufficient to transform the liquid phase into the desired oxide superconductor.

Yet another aspect of the present invention provides for a multi filamentary oxide superconductor composite containing a plurality of oxide superconductor filaments contained within a matrix material which has been subjected to the final heat treatment of the invention.

In yet another aspect of the invention, a multifilamentary oxide superconductor composite contains a plurality of oxide superconductor filaments contained within a matrix material, the composite having a $J_c$ of at least $14 \times 10^3$ A/cm$^2$ at 77 K, self field, as measured over a length of at least 50 m.

The present invention provides oxide superconductors which exhibit marked improvement in critical current density ($J_c$) over samples processed in an otherwise similar manner, lacking only the final heat treatment of the present invention.

DESCRIPTION OF THE PREFERRED EMBODIMENT

The present invention is a method for improving the critical current density of oxide superconductor articles by healing defects, such as micro- and macrocracks, incurred upon deformation. The present invention calls for a final two-step treatment after deformation of the oxide superconductor article, in which (a) a liquid phase is formed such that the liquid phase coexists with the desired oxide superconductor; and (b) the liquid phase is then transformed into the desired oxide superconductor without any intermediate deformation. The methods of the invention can be used to heal defects in any oxide superconductor or superconducting composite as long as a liquid phase can co-exist with the desired oxide superconductor phase. It is recognized, that complete transformation of the liquid to the oxide superconductor occurs under ideal conditions and that, under some circumstances, not all of the liquid may be transformed into the desired oxide superconductor.

The liquid phase is formed upon partial melting of the oxide superconductor article. During partial melting of the article, non-superconducting materials and intermediate oxide phases may be present with the desired oxide superconductor phase. During the partial melting step of the invention the desired oxide superconductor, the non-superconducting materials, oxide superconducting precursors, the desired oxide superconductor or a mixture of these components may melt to form the liquid phase.

The above process, which required that liquid co-exist with the desired oxide superconductor phase, is distinguished from those which involve the peritecitic decomposition of the oxide superconductor, such as described by Guo et al. and Kase et al., in which the desired oxide superconductor decomposes during the melting process.

Figure 1:
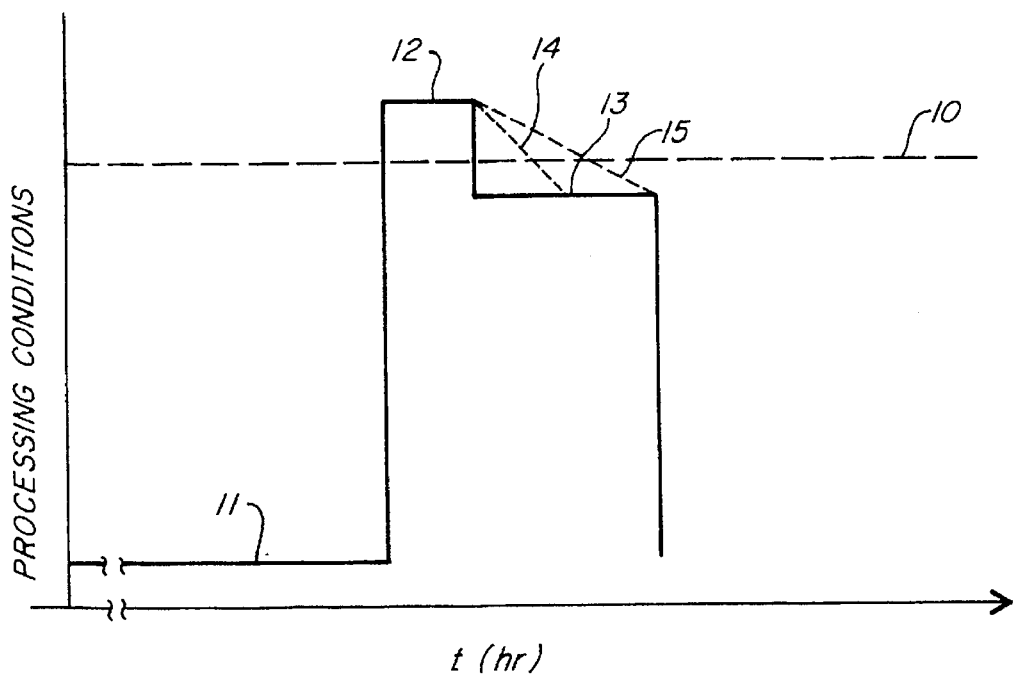
FIG. 1 is a processing profile of the final heat treatment of the invention.

FIG. 1 shows a processing profile of the final heat treatment of the invention. A dashed line 10 indicates a processing point at which a liquid phase is formed for a given set of processing conditions, e.g., T, $P_{O_2}$, $P_{total}$ and/or oxide composition.

In the oxide superconductors and superconducting composites disclosed herein, processing conditions for obtaining the requisite liquid and solid oxide phases are well established and the relationship between temperature, oxygen partial pressure and total pressure is reasonably well understood. For further information on the phase diagrams for YBCO, BSCCO and the thallium-based systems, the interested reader is directed to "Phase Diagrams for High $T_c$ Superconductors", John D. Whirler and Robert S. Roth, Ed.; American Ceramic Society, Westerville, Ohio.

Presence of a liquid phase can also be determined experimentally by use of such conventional techniques as differential thermal analysis (DTA). In DTA, exothermic and endothermic reactions as a function of temperature can be identified and attributed to various thermodynamic and chemical processes. It is possible to identify endothermic processes corresponding to partial melting; i.e. liquid phase formation.

It is desired that only a small amount of liquid be formed during partial melting. The reason for this is that, at the time that the final heat treatment is applied, the article substantially is already textured. Complete or significant liquid formation at this point would result in loss of texture. Volume percent of the liquid phase is typically in the range of 0.1 to 30.

The oxide superconductor is deformed at a point 11 before the final heat treatment, at which time defects such as microcracks may be introduced into the article. Suitable deformation can include swaging, extruding, drawing, pressing, hot and cold isostatic pressing, rolling, and forging of wires, tapes and a variety of shaped articles.

Figure 2A:
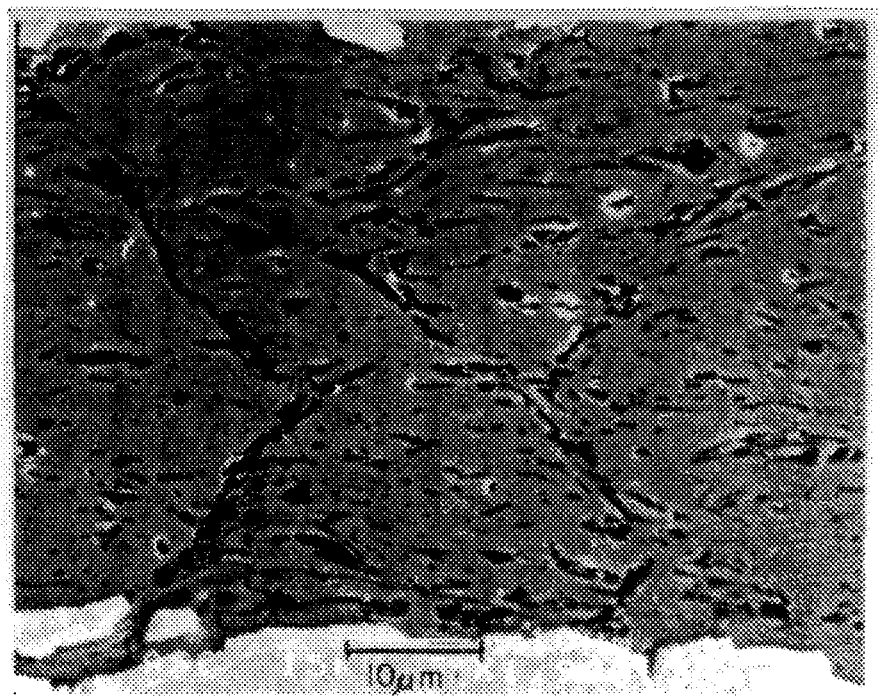
FIG. 2 is an optical photomicrograph of (a) a pressed oxide superconductor article without the final heat treatment of the invention, and (b) a pressed oxide superconductor article subjected to the final heat treatment of the invention.
Figure 2B:
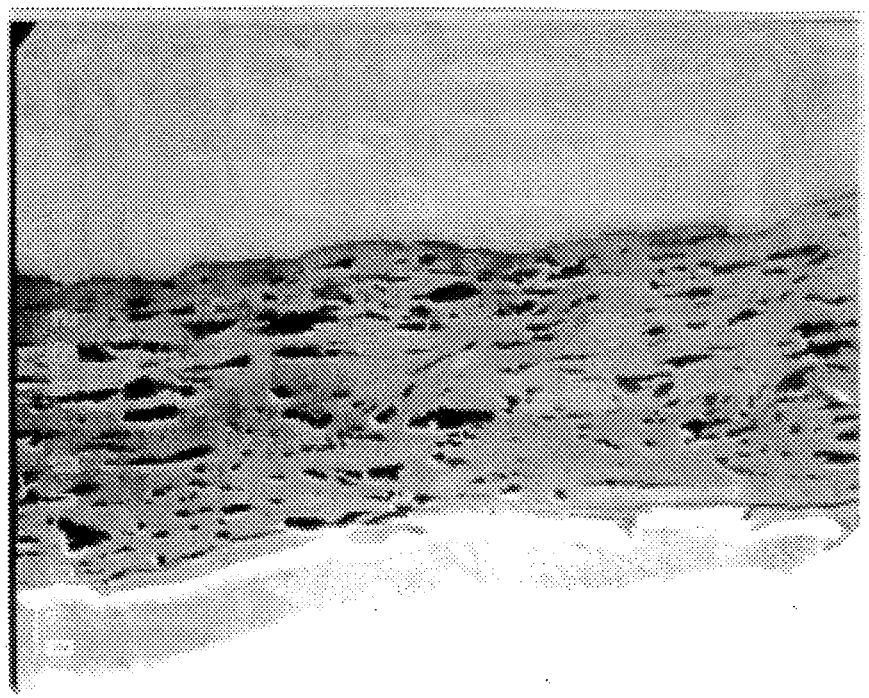

The method of the invention is particularly useful for oxide superconductor articles in which deformation processing introduces defects perpendicular to the direction of current flow. In rolling, the deformation is largely plane strain, that is, extension in the length of the article entirely compensates for the reduction in thickness resulting in cracking in the transverse direction and perpendicular to the current flow. FIG. 2a shows an optical photomicrograph of a pressed oxide superconductor filament without the final heat treatment of the invention. Many fine cracks are visible and clearly disrupt the percolative pathway for current flow. It is expected therefore, that rolled samples will benefit to a greater extent from the final heat treatment of the invention.

Other deformation processes, such as pressing, results in reduction of the article thickness accommodated by lateral spread, i.e., an increase in width. Cracks in this case form parallel to the current flow. While defects of this type, can be healed by the final heat treatment of the invention, the improvement to the electrical properties may not be as marked.

Referring again to FIG. 1, the processing conditions are adjusted to bring the article to point 12 where the article is partially melted and a liquid phase co-exists with the desired oxide superconductor phase. The article is held at point 12 for a period of time during which the defect surfaces contained within the oxide superconductor are wet by the newly-formed liquid. In the case of BSCCO-2223, a temperature of 820°–835° C. at 0.075 atm $O_2$ for 0.1–300 hours is sufficient. The processing parameters are then adjusted to bring the oxide superconductor to point 13 where the liquid phase is consumed and the desired oxide superconductor phase is formed from the melt. In the case of BSCCO-2223, a temperature of 820°–790° C. at 0.075 atm $O_2$ for 1 to 300 hours is sufficient.

The final heat treatment includes heating the article at a temperature of substantially in the range of 815° C. to 860° C. for a period of time substantially in the range of 0.1 to 300 h at a $P_{O2}$ substantially in the range of 0.001–1.0 atm. The processing temperature will vary dependent upon the oxygen pressure. Additionally, variations in the chemical composition of the article will also affect selection of temperature and pressure. In particular, it has been noted that addition of silver to the oxide composition lowers the temperature range for partial melting, particularly at higher $P_{O2}$ (0.1–1.0 atm).

Hence, the final heat treatment heals cracks and other defects while effecting the final conversion of the oxide phases to the desired oxide superconductor phase. The formation of BSCCO-2223 from BSCCO-2212 is kinetically enhanced by the presence of the liquid phase, in part, due to the enhanced diffusivity of the oxide superconductor constituents. The partial melting during the final part of the process can perform two tasks. Firstly, the cracks formed during the prior deformation steps are healed by rapid growth of the oxide superconductor grains at the crack site. Secondly, the conversion rate of 2212 to 2223 is greatly accelerated, allowing the formation of a microscopically crack-free, interconnected 2223 phase.

Various processing parameters can be controlled to obtain the necessary partial melt and oxide reforming steps. For example, $P_{O2}$ can be held constant and temperature can be raised to promote melting and formation of the liquid phase and lowered to regenerate the desired oxide superconductor. Alternatively, temperature can be held constant, and $P_{O2}$ can be lowered to promote the partial melting of the oxide superconductor article and raised to reform the oxide superconductor.

The processing conditions can be changed rapidly from point 12 to point 13 of the process (fast ramp rate). Alternatively, the oxide superconductor can be subjected to gradually changing conditions (of temperature or pressure) between point 12 and point 13 of the process designated by the curve 14 in FIG. 1 (slow ramp rate). In another alternative embodiment, there need be no "hold" at 13. The processing conditions can be slowly ramped from the processing conditions defined at point 12 to the processing conditions defined for point 13. This process is illustrated by curve 15 in FIG. 1.

The method of forming textured oxide superconducting articles is described with reference to oxides of the BSCCO family; however, this is in no way meant to limit the scope of the invention. The present invention can be practiced with any oxide superconductor system in which a liquid phase co-exists with an oxide superconductor phase and which is amenable to deformation-induced texture.

Texture may be induced by reaction conditions and/or deformation. In reaction-induced texture, processing conditions are chosen to kinetically favor the anisotropic growth of oxide superconductor grains. Reaction-induced texture can occur in a solid phase system or, preferably, in a solid-plus-liquid phase system. The presence of a liquid phase enhances the kinetics of anisotropic grain growth, probably through increased rates of diffusion of the oxide components. In deformation-induced texture, a strain is applied to the superconducting article to induce alignment of the oxide grains in the plane or direction of elongation. Deformation-induced texture requires aspected grains or an anisotropic rheology in order to effect a preferential alignment of the grains.

Figure 3:
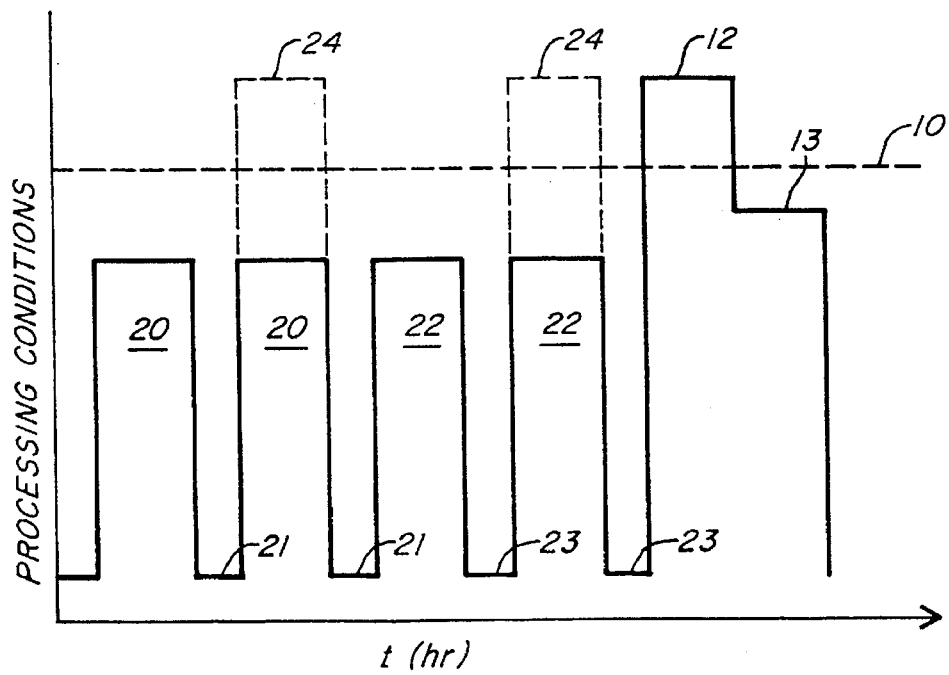
FIG. 3 is a processing profile used to obtain an textured oxide superconductor according to the method of the invention.

FIG. 3 shows a processing profile for a method of the invention used to obtain highly textured oxide superconductor articles. The general process for the formation of a textured oxide superconductor may consist of three distinct steps.

In a first step, an oxide superconductor precursor is subjected to one or more first anneal/deformation iterations, denoted by step 20 and step 21, respectively, of FIG. 3. The oxide superconductor precursor can be any combination of materials which will yield the desired oxide superconductor upon reaction. In particular, it may be a metallic alloy containing the metallic constituents of the desired oxide superconductor and optionally containing silver. Alternatively, the constituent simple metal oxides, mixed metal oxides, metal salts and even intermediate oxide superconductors of the desired oxide superconductor may be used as a precursor. The precursor may optionally be mixed with a matrix metal, such as silver, and/or may be sheathed in a matrix material in a powder-in-tube configuration.

The anneal 20 of the anneal/deformation iteration serves two purposes in the process. Firstly, the anneal is sufficient to form an oxide superconductor and results typically in a mixture of superconducting and secondary phases. "Secondary phases" include sub-oxide or nonsuperconducting oxide species which require further processing to form an oxide superconductor phase. BSCCO-2212 is often the intermediate oxide superconductor because it is readily textured during mechanical deformation. BSCCO-2223 is the typical desired oxide superconducting phase because of its high critical temperature. Secondly, the anneal promotes reaction-induced texture.

The deformation 21 of the article promotes deformation-induced texture. One or more iterations can be performed. FIG. 3 shows two first anneal/deformation iterations, by way of example. If more than one iteration is performed, both conversion to the superconducting phase and development of texture can be done in incremental stages.

If the desired oxide superconductor is not formed in the first anneal/deformation iterations, the second step of the process may consist of one or more second anneal/deformation iterations to form the desired oxide superconductor and to further texture the oxide superconductor phase. The article is annealed in a step indicated by 22 whereby the desired oxide superconductor is formed and reaction-induced texture can occur. Secondary phases react with BSCCO-2212 to form the desired oxide superconductor, BSCCO-2223. The article is deformed in a subsequent step indicated by 23, whereby deformation-induced texture can occur. One or more second anneal/deformation iterations can be performed. FIG. 3 shows two iterations, by way of example. If more than one iteration is used, only a portion of the intermediate oxide superconductor, need be converted into the desired oxide superconductor with each iteration. Conditions known to form intermediate and desired oxide superconductors are well known in the art. Suitable conditions are described in Sandhage, et al. JOM, 21 (Mar. 1991), hereby incorporated by reference.

Practically, the incremental improvement in alignment for both anneal/deformation cycles will decrease markedly after several iterations, however, there is no theoretical limit to the number of iterations that can be used. The strain introduced in the deformation step can range up to 99%. The strains applied in each deformation/anneal iteration may be constant or they may be changed for each subsequent iteration. It is particularly desirable in some embodiments, to use decreasing strains with each subsequent iteration.

It is also possible to adjust the processing conditions to promote partial melting during the anneal 20 or 22 of the anneal/deformation iterations, indicated by step 24, to assist in grain growth and enhance reaction kinetics (reaction-induced texture). An anneal in the range of 820°–835° C. in 0.075 atm $O_2$ and 1 atm total pressure for 0.1 to 100 hours is typical for partial melting to occur.

The final part of the process consists of a two-step heat treatment in which (a) the article is processed to form a liquid phase which co-exists with the desired oxide superconductor followed by (b) processing of the article under conditions that favor the formation of the desired oxide superconductor phase.

The oxide superconductors which make up the oxide superconductor articles of the present invention are brittle and typically would not survive a mechanical deformation process, such as rolling or pressing. For this reason, the oxide superconductors of the present invention are typically processed as a composite material including a malleable matrix material. In particular, silver is preferred as the matrix material because of its cost, nobility and malleability. The oxide superconductor composite may be processed in any shape, however, the form of wires, tapes, rings or coils are particularly preferred. The oxide superconductor may be encased in a silver sheath, in a version of the powder-in-tube technology. The oxide superconductor can take the form of multiple filaments embedded within a silver matrix. For further information on superconducting tapes and wires; see, Sandhage et al.

EXAMPLE 1

The following example compares the transport critical current characteristics of a samples treated with the two-step heat treatment of the present invention to those of conventionally processed samples.

Precursor powders were prepared from the solid state reaction of freeze-dried precursor of the appropriate metal nitrates having the nominal composition of 1.7:0.3:1.9:2.0:3.1 (Bi:Pb:Sr:Ca:Cu). $Bi_2O_3$, $CaCO_3$, $SrCO_3$, $Pb_3O_4$ and CuO powders could be equally used. After thoroughly mixing the powders in the appropriate ratio, a multistep treatment (typically, 3–4 steps) of calcination (800° C.±10° C., for a total of 15 h) and intermediate grinding was performed in order to remove residual carbon, homogenize the material and to generate the low $T_c$ BSCCO-2212 oxide superconductor phase. The powders were packed into silver sheaths having an inner diameter of 0.625" (1.5875 cm) and a length of 5.5" (13.97 cm) and a wall thickness of 0.150" (0.38 cm) to form a billet.

The billets were extruded to a diameter of ¼" (0.63 cm). The billet diameter was narrowed with multiple die passes, with a final pass drawn through a 0.070" (0.178 cm) hexagonally shaped die into silver/oxide superconductor hexagonal wires. Nineteen of the wires were bundled together and drawn through a 0.070" (0.178 cm) round die to form a multifilamentary round wire. The round wire was rolled to form a 0.009"×0.100" (0.023 cm×0.24 cm) multifilamentary tape.

A length of the composite tape was then subjected to a heat treatment according to the invention. The composite tape was heated in a furnace in a first anneal at 820° C. in 0.075 atm $O_2$ for 48 h. The first anneal formed significant amounts of the desired oxide superconductor phase, BSCCO-2223. The composite tape was then rolled to reduce thickness by 11% (0.009" to 0.008"). Lastly, the rolled composite tape was subjected to a final two-step heat treatment, namely, heating from room temperature at a rate of 1° C./min to 820° C. in 0.075 atm $O_2$ and holding for 54 h, cooling to 810° C. in 0.075 atm $O_2$ and holding for 30 h. The sample was furnace cooled to room temperature in 1 atm $P_{O2}$.

A length of composite tape was also subjected to a conventional heat treatment. The composite tape was heated in a furnace in a first anneal at 820° C. in 0.075 atm $O_2$ for 48 h. The first anneal caused significant amounts of the desired oxide superconductor phase, BSCCO-2223 to form. The composite tape was then rolled to reduce thickness by 11% (0.009" to 0.008"). The control samples were then subjected to a second anneal at 810° C. in 0.075 atm $O_2$ for 84 h. This was a single step heat treatment in which no melting of the sample occurs.

The microstructure of the samples were evaluated under an optical microscope. The samples prepared according to the method of the invention had a higher density and far less cracks than the control samples.

The critical currents of the samples using a criterion of 1 µV/cm, 77 K and zero applied field were determined. A single critical current was determined end-to-end over a long length of tape (7–10 m). Critical current for a number of 10 cm lengths of composite tapes were determined and an average value was determined. Critical current ($I_c$ in A) is related to the critical current density ($J_c$ in A/cm²) by the relationship, $J_c \cong 1{,}250 \bullet I_c$. The results are reported in Table 1 and show that samples processed according to the method of the invention exhibited a factor of at least two improvement in critical transport properties.

TABLE 1

A comparative study of the method of the invention with a conventional process.

| sample no. | length (m) | $I_c$ (A) | % σ | $J_c$ (A/cm²) |
| --- | --- | --- | --- | --- |
| Example 1-1 | 10 | 6.05 | — | 7563 |
| Example 1-2 | 0.1 | 9.52 | 13 | 11,900 |
| Control 1-1 | 7 | 2.23 | — | 2788 |
| Control 1-2 | 0.1 | 4.08 | 16 | 5100 |

EXAMPLE 2

This example demonstrates that silver alloys can be used in place of silver for the silver billet without detrimental effect on the electrical properties of the composite. A composite tape is prepared as described in Example 1; however, a silver alloy containing low levels of Mg and Ni was used to sheathe the oxide superconductor. The tape was processed as in Example 1 according to the method of the invention. The average $I_c$ (77 K, 10 cm) was 7.68 A as compared to ca. 4.08 A for a conventional process.

EXAMPLE 3

This example compares samples which have been pressed or rolled as the intermediate deformation.

Composite tapes were prepared as described in Example 1. A statistically designed experiment was performed using the following process parameters for the first anneal and final heat treatments.

| | | | final heat treatment | | | |
|---|---|---|---|---|---|---|
| first anneal | | high temperature | | low temperature | | |
| T(°C.) | t(h) | | T(°C.) | t(h) | T(°C.) | t(h) |
| − | 820 | 12 | − | 820 | 12 | − | 810 | 36 |
| 0 | 827 | 24 | 0 | 827 | 24 | 0 | 815 | 54 |
| + | 835 | 48 | + | 835 | 48 | + | 815 | 72 |

Up to sixty four statistically selected combinations of reaction conditions were run both with and without the final two-step heat treatment of the invention. The intermediate deformation step between the first anneal and final heat treatment consisted of a pressing with 12% strain reduction.

Comparable statistically designed experiments were carried out for rolled samples with and without the two step final heat treatment of the invention. The intermediate deformation step between the first and final heat treatment consisted of rolling with 12% strain reduction. Critical currents (77 K, 0 T) were measured across 1 cm. The results are reported in Table 2.

TABLE 2

Comparison of pressed and rolled composite tapes.

| sample no. | deformation treatment | final heat treatment | n | $I_c(\sigma)$ (A) | $J_c$ (A/cm$^2$) |
|---|---|---|---|---|---|
| 3-1 | press | two step | 60 | 10.63(2.43) | 13,288 |
| 3-2 | press | one step | 6 | 9.45(0.20) | 11,812 |
| 3-3 | roll | two step | 60 | 11.71(1.09) | 14,638 |
| 3-4 | roll | one step | 64 | 3.41(0.77) | 4,263 |

The results found in Table 2 show that both pressed and rolled samples benefitted from the final heat treatment of the invention. The benefit is greater for rolled samples because rolling results in microcracking perpendicular to the direction of current flow, which is the most deleterious to transport critical current and the most responsive to the healing effect of the present invention.

EXAMPLE 4

This example shows the effect of the number of anneal/deformation iterations on critical transport properties of the samples.

Ten meter lengths of composite tape were prepared as described for Example 1. The composite tapes were heated in a furnace in a first anneal at 815° C. in 0.075 atm $O_2$ for 48 h. The composite tapes were then rolled to reduce thickness by 12%. The above anneal and deform iteration was carried out for x=2, x=3 and x=4 iterations on three samples, respectively. Lastly, the deformed composite tapes were subjected to a two-step heat treatment according to the invention, namely, heating at 824° C. in 0.075 atm $O_2$ for 54 h, followed by heating at 815° C. in 0.075 atto $O_2$ for 30 h. The final thickness for each tape was 0.0080" (0.020 cm). The critical transport measurements for the three samples are given in Table 3. All samples exhibited critical currents higher than that of the control sample (3 A). In this series of samples, the incremental improvement to critical current was maximized at n =3; however, dependent upon the particular experimental conditions, it may be desirable to perform more or less iterations.

TABLE 3

Effect of Iteration Number on Critical Transport

| sample no. | x | $I_c$ (A) | $J_c$(A/cm$^2$) |
|---|---|---|---|
| 4-1 | 2 | 6.35 | 7938 |
| 4-2 | 3 | 7.83 | 9788 |
| 4-3 | 4 | 6.98 | 8725 |

EXAMPLE 5

The affect of precursor powder stoichiometry was investigated. Composite tapes were prepared as described in Example 1, with the following exception. Powders of different stoichiometry were used in the preparation the composite tapes.

Powder A: 1.8:0.4:2.0:2.2:3 Bi:Pb:Sr:Ca:Cu
Powder B: 1.7:0.3:1.9:2.0:3.1 Bi:Pb:Sr:Ca:Cu The composite tapes prepared from powders A and B were subjected to the following anneal/deformation cycle:
(1) anneal: 815° C., 0.075 atm $O_2$, 48 h
(2) deformation: roll, 12% strain
(3) anneal: 815° C., 0.075 atm $O_2$, 48 h
(4) deformation: roll, 12% strain
(5) two step heat treatment as described in Example 4

The final thickness of the tapes was 0.008" (0.020 cm). Critical current measurements are reported in Table 4.

TABLE 4

Effect of sample composition on critical current.

| sample | | 60 m length | | 10 cm lengths | |
|---|---|---|---|---|---|
| no. | powder | $I_c$ (A) | $J_c$ (A/cm$^2$) | $I_c(\sigma)$ (A) | $J_c$ (A/cm$^2$) |
| 5-1 | A | 8.44 | 7,174 | 11.8(1.3) | 10,030 |
| 5-2 | B | 10.4 | 8,840 | 11.1(1.2) | 9,435 |

EXAMPLE 6

A composite tape was prepared according to the processed described in Example 1. The composite tape having a length of 44 m was subjected to an anneal/deformation iteration comprised of an anneal at 815° C. for 48 h under 0.075 atm $O_2$ and an 18% rolling deformation. The iteration was repeated three times. The final heat treatment consisted of heating at 824° C. for 96 h (0.075 $P_{O2}$), followed by heating at 815° C. for 30 h (0.075 $P_{O2}$). The sample had a materials $J_c$ measurement of greater than 17,000 A/cm$^2$ (77 K, self field).

As can be seen by the above examples, the method of the invention is highly versatile and can be successfully used with a variety of deformation processes, oxide superconductor compositions, silver alloy compositions and processing conditions.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for preparing a BSCCO-2223 oxide superconductor article, comprising the steps of:

deforming an oxide superconductor article, the article comprised of at least BSCCO-2223, whereby deformation induces alignment of a c-axis of the BSCCO-2223 oxide superconductor;

exposing the oxide superconductor article to a two-step heat treatment after deformation of the article, the heat treatment comprising, (a) heating the article to and maintaining the article at a temperature in the range of about 815°–860° C. for a period of time in the range of about 0.1 to 300 hours at a $P_{O2}$ in the range of about 0.001–1.0 atm; and (b) cooling the article to and maintaining the article at a temperature range of about 780°–845° C. and a $P_{O2}$ range of about 0.01–1.0 atm for a time period of about 1 to 300 hours, the method characterized in that no deformation which is capable of introducing defects perpendicular to the direction of current flow occurs after the two-step heat treatment.

2. A method for preparing a BSCCO-2223 oxide superconductor article, comprising the steps of:

deforming an oxide superconductor article, the article comprised of at least BSCCO-2223, whereby deformation induces alignment of a c-axis of the BSCCO-2223 oxide superconductor;

exposing an oxide superconductor article to a two-step heat treatment after deformation of the article, the heat treatment comprising, (a) heating the article to and maintaining the article at a temperature in the range of about 815°–860° C. for a period of time in the range of about 0.1 to 300 hours at a $P_{O2}$ in the range of about 0.001–1.0 atm; and (b) cooling the article to and maintaining the article at a temperature range of about 780°–845° C. for a period of time in the range of about 30 to 300 hours at a $P_{O2}$ in the range of about 0.01–1.0 atm, the method characterized in that no deformation which is capable of introducing defects perpendicular to the direction of current flow occurs after the two-step heat treatment.

3. A method for preparing a BSCCO-2223 oxide superconductor article, comprising the steps of:

deforming an oxide superconductor article, the article comprised of at least BSCCO-2223, whereby deformation induces alignment of a c-axis of the BSCCO-2223 oxide superconductor; and exposing the the oxide superconductor article to a two-step heat treatment after deformation of the article, the heat treatment comprising, (a) heating the article to and maintaining the article at a first temperature and pressure range sufficient to partially melt the article, such that a liquid phase co-exists with the BSCCO-2223 oxide superconductor phase; and (b) cooling the article to and maintaining the article in a second temperature and pressure range sufficient to substantially transform the liquid phase into the BSCCO-2223 oxide superconductor, and holding the article in the second temperature and pressure range for at time sufficient to substantially transform the liquid phase into the BSCCO-2223 oxide phase, the method characterized in that no deformation occurs after the two-step heat treatment.

4. The method of claim 1 or 3, wherein the heat treatment of step (a) forms a liquid phase which wets surfaces of a defect contained within the oxide superconductor phase, whereby upon transformation of the liquid in step (b) to the desired oxide superconductor, the defect is healed.

5. The method of claim 1 or 3, wherein the deformation is selected from the group consisting of rolling, pressing, isostatic pressing, drawing, swaging, extrusion and forging.

6. The method of claim 1 or 3, wherein the deformation elongates the article and is selected from the group consisting of rolling, drawing and extrusion.

7. The method of claim 1, 2 or 3, wherein the heat treatment of step (a) is carried out at a temperature substantially in the range of 820° to 835° C.

8. The method of claim 1, 2 or 3, wherein the heat treatment of step (b) is carried out at a temperature substantially in the range of 790° to 820° C.

9. The method of claim 1 or 3, wherein the heat treatment of step (a) forms a liquid phase in the range of 0.1 to 30 vol %.

10. The method of claim 1 or 3, further comprising:

subjecting an article comprising a BSCCO-2223 oxide superconductor precursor to a first anneal, the first anneal sufficient to form an article comprising BSCCO-2212;

deforming the BSCCO-2212 oxide superconductor article, whereby deformation induces alignment of a c-axis of the BSCCO-2212 oxide superconductor; and subjecting the BSCCO-2212 article to a second anneal, the second anneal sufficient to form an article comprising BSCCO-2223, said first anneal-deformation-second anneal occurring prior to the deformation of the BSCCO-2223 article.

11. The method of claim 10, wherein the anneal step of the first anneal/deformation iteration partially melts the oxide superconductor article.

12. The method of claim 10, wherein the anneal step of the second anneal/deformation iteration partially melts the oxide superconductor article.

13. The method of claim 5 or 3, wherein the two-step heat treatment is performed two to twelve times.

14. The method of claim 1 or 3, wherein the deformation before the two-step heat treatment is selected to form defects perpendicular to the direction of current flow in the article.

15. The method of claim 1, 2 or 3, wherein the temperature of step (a) is maintained for a period of time in the range of 54 to 300 hours.

16. The method of claim 1, 2 or 3, wherein the heating conditions are altered gradually between step (a) and (b) of the two-step heat treatment.

17. The method of claim 1, 2 or 3, wherein the heating conditions are changed gradually throughout the heat treatment of step (a) and/or (b).

18. The method of claim 1, 6, 2 or 3, wherein the two-step heat treatment is carried out at a constant temperature.

19. The method of claim 1, 6, 2 or 3, wherein the two-step heat treatment is carried out at constant $P_{O2}$.

20. The method of claim 1 or 2, wherein the heat treatment of step (a) is carried out under conditions to form a liquid phase.

21. The method of claim 1 or 3, further comprising:

subjecting the BSCCO-2223 article to an anneal prior to deformation, the anneal effective to form BSCCO-2223.

* * * * *

UNITED STATES PATENT AND TRADEMARK OFFICE
CERTIFICATE OF CORRECTION

| | |
|---|---|
| PATENT NO. | : 5,635,456 |
| APPLICATION NO. | : 08/041822 |
| DATED | : June 3, 1997 |
| INVENTOR(S) | : Gilbert N. Riley, Jr., Alexander Otto and William L. Carter |

It is certified that error appears in the above-identified patent and that said Letters Patent is hereby corrected as shown below:

Column 5, line 19; please delete "multi filamentary" and insert therefor --multifilamentary--.

Column 14, line 44 in claim 13; please delete "5 or 3" and insert therefor --1 or 3--.

Column 14, line 58 in claim 18; please delete "1, 6, 2 or 3" and insert therefor --1, 2, 3 or 6--.

Column 14, line 60 in claim 19; please delete "1, 6, 2 or 3" and insert therefor --1, 2, 3 or 6--.

Signed and Sealed this

Twenty-third Day of October, 2007

JON W. DUDAS
*Director of the United States Patent and Trademark Office*